United States Patent [19]
Rolfson et al.

[11] Patent Number: 5,926,739
[45] Date of Patent: Jul. 20, 1999

[54] SEMICONDUCTOR PROCESSING METHOD OF PROMOTING PHOTORESIST ADHESION TO AN OUTER SUBSTRATE LAYER PREDOMINATELY COMPRISING SILICON NITRIDE

[75] Inventors: J. Brett Rolfson; Annette L. Martin; Ardavan Niroomand, all of Boise, Id.

[73] Assignee: Micron Technology, Inc., Boise, Id.

[21] Appl. No.: 08/567,090

[22] Filed: Dec. 4, 1995

[51] Int. Cl.$^6$ .................................................. H01L 21/318
[52] U.S. Cl. .......................... 438/763; 438/791; 438/948; 430/272.1
[58] Field of Search .................................. 437/229, 238, 437/241, 235; 430/166, 272.1; 438/791, 764, 778, 763, 948

[56] References Cited

U.S. PATENT DOCUMENTS

| | | | |
|---|---|---|---|
| 3,884,698 | 5/1975 | Kakihama et al. | 430/272.1 |
| 4,330,569 | 5/1982 | Gulett et al. | 427/38 |
| 4,499,656 | 2/1985 | Fabian et al. | 29/576 |
| 4,996,081 | 2/1991 | Ellul et al. | 438/763 |
| 5,045,345 | 9/1991 | Singer | 427/38 |
| 5,045,847 | 9/1991 | Tarui et al. | 340/783 |
| 5,219,788 | 6/1993 | Abernathey et al. | 430/272.1 |
| 5,489,542 | 2/1996 | Iwai et al. | 437/241 |
| 5,518,946 | 5/1996 | Kuroda | 437/241 |
| 5,554,418 | 9/1996 | Ito et al. | 427/579 |

FOREIGN PATENT DOCUMENTS

| | | |
|---|---|---|
| 362137854 | 6/1987 | Japan . |
| 401086562 | 3/1989 | Japan . |
| 403075158 | 3/1991 | Japan . |
| 2129217 | 5/1984 | United Kingdom ................ 430/272 |
| 2145243 | 3/1985 | United Kingdom ................ 430/272 |
| 2170649 | 8/1986 | United Kingdom ................ 430/272 |

OTHER PUBLICATIONS

Wolf, Stanley *Silicon Processing for the VLSI Era*, vol. 1, pp. 177–178, 1986.
Wolf, Stanley *Silicon Processing for the VLSI Era*, vol. 2, pp. 37, 38, 598, 599, 1990.

*Primary Examiner*—Charles Bowers
*Assistant Examiner*—Matthew Whipple
*Attorney, Agent, or Firm*—Wells, St. John, Roberts, Gregory & Matkin, P.S.

[57] ABSTRACT

A semiconductor processing method of promoting adhesion of photoresist to an outer substrate layer predominately comprising silicon nitride includes, a) providing a substrate; b) providing an outer layer of $Si_3N_4$ outwardly of the substrate, the outer $Si_3N_4$ layer having an outer surface; c) covering the outer $Si_3N_4$ surface with a discrete photoresist adhesion layer; and d) depositing a layer of photoresist over the outer $Si_3N_4$ surface having the intermediate discrete adhesion layer thereover, the photoresist adhering to the $Si_3N_4$ layer with a greater degree of adhesion than would otherwise occur if the intermediate discrete adhesion layer were not present. Further, a method in accordance with the invention includes, i) providing an outer layer of $Si_3N_4$ outwardly of the substrate, the outer $Si_3N_4$ layer having an outer surface; ii) transforming the outer $Si_3N_4$ surface into a material effective to promote adhesion of photoresist to the $Si_3N_4$ layer; and iii) depositing a layer of photoresist over the transformed outer $Si_3N_4$ surface, the photoresist adhering to the $Si_3N_4$ layer with a greater degree of adhesion than would otherwise occur if the outer $Si_3N_4$ surface were not transformed.

3 Claims, 2 Drawing Sheets

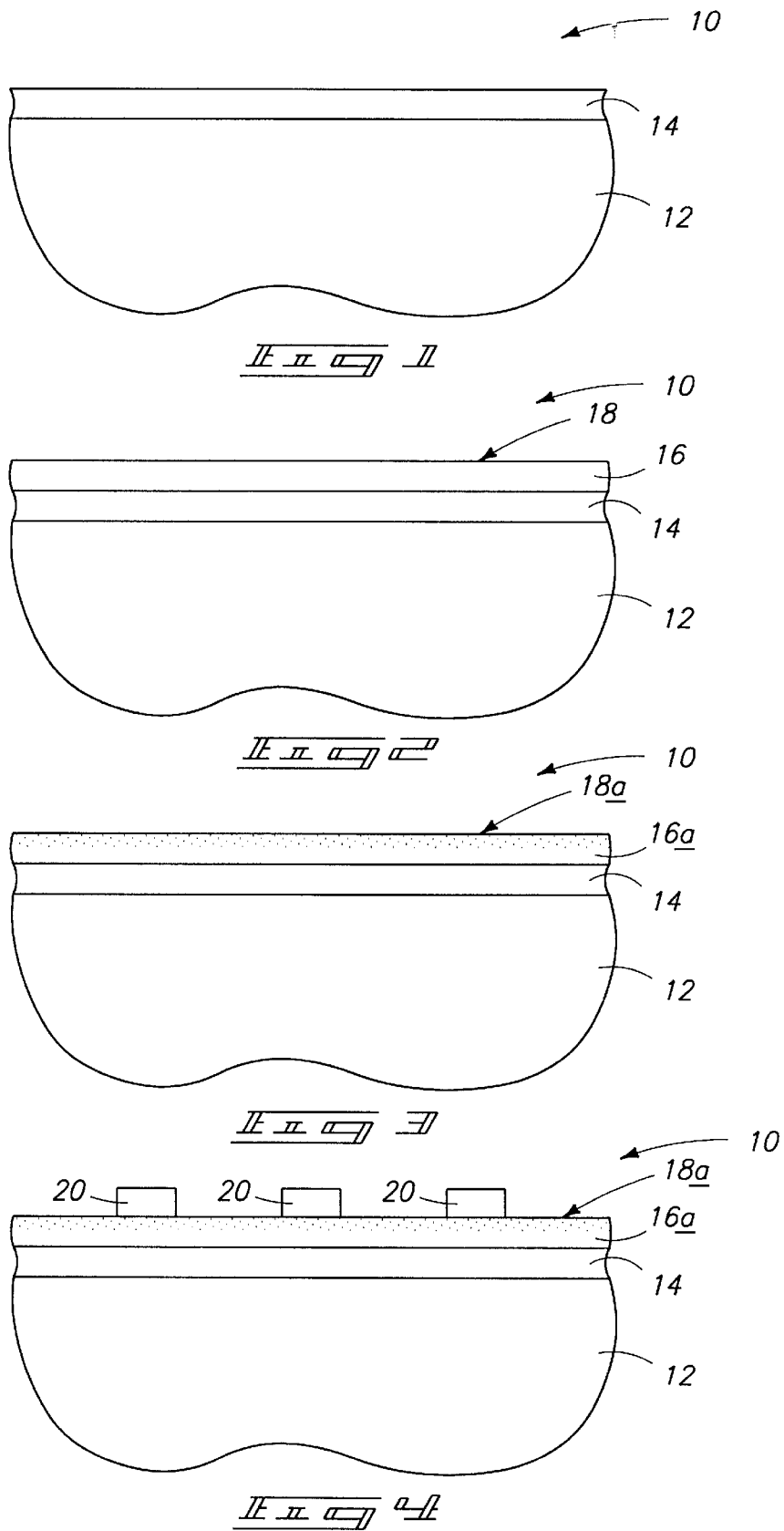

SEMICONDUCTOR PROCESSING METHOD OF PROMOTING PHOTORESIST ADHESION TO AN OUTER SUBSTRATE LAYER PREDOMINATELY COMPRISING SILICON NITRIDE

TECHNICAL FIELD

This invention relates generally to semiconductor processing methods of promoting adhesion of photoresist to an outer substrate layer predominantly comprising silicon nitride.

BACKGROUND OF THE INVENTION

Microcircuit fabrication involves provision of precisely controlled quantities of impurities into small regions of a silicon substrate, and subsequently interconnecting these regions to create components and integrated circuits. The patterns that define such regions are typically created by a photolithographic process. Such processing sets the horizontal dimensions on the various parts of the devices and circuits. Photolithography is a multistep pattern transfer process similar to stenciling or photography. In photolithograpy, the required pattern is first formed in reticles or photomasks and transferred into the surface layer(s) of the wafer through photomasking steps.

Inherent in photolithograpy is application and adherence of photoresist materials to underlying substrates. The resist must be capable of adhering to these surfaces through all the resist processing and etch steps. Poor adhesion brings about severe undercutting, loss of resolution, or possibly the complete loss of the pattern. Wet etching techniques demand a high level of adhesion of the resist film to the underlying substrates.

Various techniques are used to increase the adhesion between resist and a substrate such as, a) dehydration baking prior to coating; b) use of hexamethyldisilazane (HMDS) and vapor priming systems to promote resist adhesion for polysilicon, metals and $SiO_2$ layers, and c) elevated temperature post-bake cycles. HMDS functions as an effective adhesion promoter for silicon and silicon oxide containing films, but provides effectively no surface-linking adhesion promotion with respect to silicon nitride films.

Accordingly, it would be desirable to develop alternate and improved techniques for providing better adhesion of photoresist to silicon nitride films.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer fragment at a processing step subsequent to that shown by FIG. 1.

FIG. 3 is a view of the FIG. 1 wafer fragment at a processing step subsequent to that shown by FIG. 2.

FIG. 4 is a view of the FIG. 1 wafer fragment at a processing step subsequent to that shown by FIG. 3.

DETAILED DESCRIPTION OF THE PREFERRED EMBODIMENTS

Figure 5:
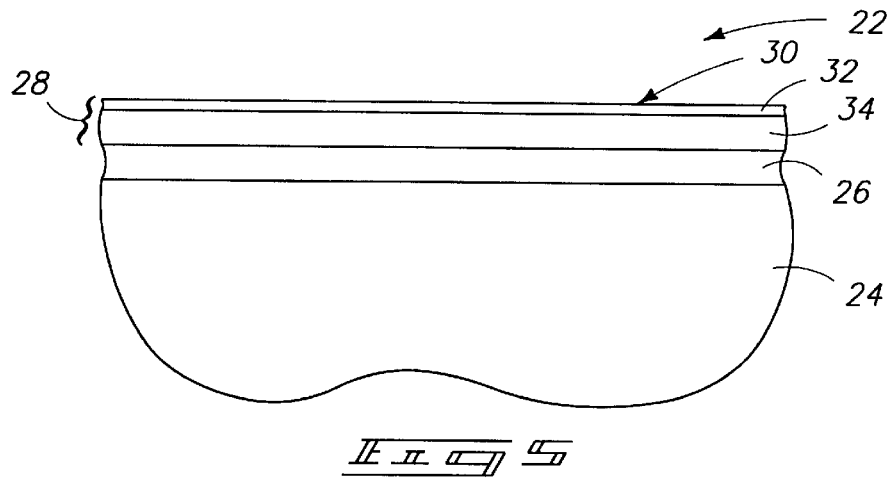
FIG. 5 is a diagrammatic sectional view of an alternate embodiment semiconductor wafer fragment at one alternate processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of promoting adhesion of photoresist to an outer substrate layer predominately comprising silicon nitride comprises the following steps:

providing a substrate;

providing an outer layer of $Si_3N_4$ outwardly of the substrate, the outer $Si_3N_4$ layer having an outer surface;

covering the outer $Si_3N_4$ surface with a discrete photoresist adhesion layer; and depositing a layer of photoresist over the outer $Si_3N_4$ surface having the intermediate discrete adhesion layer thereover, the photoresist adhering to the $Si_3N_4$ layer with a greater degree of adhesion than would otherwise occur if the intermediate discrete adhesion layer were not present.

In accordance with another aspect, a semiconductor processing method of promoting adhesion of photoresist to an outer substrate layer predominately comprising silicon nitride comprises the following steps:

providing a substrate;

providing an outer layer of $Si_3N_4$ outwardly of the substrate, the outer $Si_3N_4$ layer having an outer surface;

transforming the outer $Si_3N_4$ surface into a material effective to promote adhesion of photoresist to the $Si_3N_4$ layer; and depositing a layer of photoresist over the transformed outer $Si_3N_4$ surface, the photoresist adhering to the $Si_3N_4$ layer with a greater degree of adhesion than would otherwise occur if the outer $Si_3N_4$ surface were not transformed.

Referring to FIGS. 1–4, and initially to FIG. 1, a semiconductor wafer fragment in process is indicated generally with reference numeral 10. Such includes a substrate composed of a bulk monocrystalline silicon substrate 12 and an overlying insulating layer 14, such as $SiO_2$. An example thickness for layer 14 is from 50 Angstroms to 300 Angstroms.

Referring to FIG. 2, an outer layer 16 of $Si_3N_4$ is provided outwardly of substrate 12/14. Nitride layer 16 includes an outer surface 18. Thickness of layer 16 will depend upon the application. For example where layer 16 is merely functioning as an etch stop in some later process step, its thickness may approximate 100 Angstroms or less. Where layer 16 is being used as a mask for a local oxidation of silicon (LOCOS), layer 16 thickness may be from 1500 Angstroms to 3000 Angstroms.

The preferred manner of depositing or otherwise providing nitride layer 16 is by chemical vapor deposition within a chemical vapor deposition reactor using a gaseous silicon containing precursor and a gaseous nitrogen containing precursor. An example preferred nitride precursor is dichlorosilane (DCS), with a preferred nitrogen containing precursor being ammonia ($NH_3$). One example set of deposition parameters includes maintaining reactor temperature and pressure at 780° C. and 250 mTorr, respectively, with the precursors being provided at a volumetric ratio of $DCS:NH_3$ at 1:3. Such is but one example set of conditions effective to deposit a $Si_3N_4$ layer on substrate 14/12.

Referring to FIG. 3, the gas flow of the nitrogen containing precursor to the chemical vapor deposition reactor is reduced, thus increasing the concentration of the silicon component of the precursor. This will have the effect of enrichening the $Si_3N_4$ layer outermost surface 18 to outermost surface 18a with silicon atoms, as depicted by the dots in the FIG. 3, to provide increased silicon concentration beyond the empirical stoichiometric relationship of silicon to nitride atoms in molecular silicon nitride. Thus, the outer silicon nitride surface has been transformed into a material (i.e. silicon enriched $Si_3N_4$) which can effectively be used to promote subsequent adhesion of photoresist to $Si_3N_4$ layer 16a. Silicon is a material to which photoresist will more readily adhere than $Si_3N_4$. An example reduction from the 1:3 $DCS:NH_3$ ratio to achieve such enrichening is to a ratio of from 1:0 to 1:1.25.

Referring to FIG. 4, a layer of photoresist is deposited over silicon enrichened outer $Si_3N_4$ surface 18a, and is for example patterned as shown to produce photoresist blocks 20. Silicon enrichened outer surface 18a can optionally be treated with suitable other adhesion primers appropriate to silicon, such as HMDS. Regardless, a desired result is photoresist material 20 adhering to $Si_3N_4$ layer 16a with a greater degree of adhesion than would otherwise occur if the outer $Si_3N_4$ surface 18 were not transformed by silicon enrichening. All of the above described processing preferably and advantageously occurs in the same single chemical vapor deposition reactor. Alternately, more than one reactor chamber can be used.

An alternate embodiment 22 is described with reference to FIGS. 5 and 6. Such comprises a substrate composed of bulk monocrystalline silicon 24 and an overlying $SiO_2$ layer 26. An outer predominantly nitride layer 28 is provided over $SiO_2$ layer 26. Such also includes an outer surface 30, the immediately underlying portion thereof which has been transformed to an oxidized material 32, preferably $SiO_2$. Bulk mass 34 of layer 28 constitutes $Si_3N_4$. The processing to produce materials 34 and 32 preferably is again conducted in a single, common chemical vapor deposition reactor.

Material 32 relative to outer surface 30 is preferably provided by feeding a gaseous oxygen containing precursor to the reactor under conditions effective to oxidize $Si_3N_4$ material 34 to $SiO_2$ material 32. One example process for accomplishing such transformation of outer surface 30 is to cease feeding the dichlorosilane and ammonia precursors as described in the above example, and purging the reactor of such gaseous precursors. Immediately thereafter, $N_2O$, $O_2$, $O_3$, or mixtures thereof are fed to the reactor under the same temperature and pressure conditions which effectively causes the outer surface of the nitride material to become oxidized to $SiO_2$. The thickness of material 32 is preferably kept very low, such as from about 10 Angstroms to about 30 Angstroms. Purging of the $Si_3N_4$ precursors is highly desirable to prevent an undesired silicon dust from falling out onto the wafer as may occur without purging, which neither produces the $SiO_2$ material of this example, nor readily adheres to the underlying substrate.

An example processing for $O_3$, would be at atmospheric or subatmospheric pressure at a temperature of 600° C. for from one to two hours. For $O_2$, an example oxidizing condition would be feeding both $O_2$ and $H_2$ at atmospheric pressure and temperatures ranging from 800° C. to 1100° C. for from 30 minutes to two hours.

Alternately but less preferred, the above processing could take place in two separate chambers, with the wafer(s) being moved from one to the other after provision of the nitride layer for subsequent provision of the adhesion promoting layer.

Figure 6:
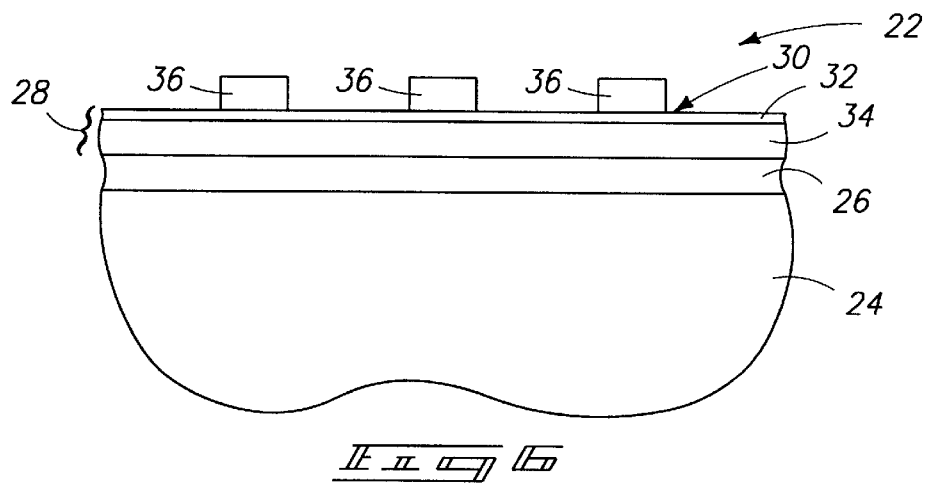
FIG. 6 is a view of the FIG. 5 wafer fragment at a processing step subsequent to that shown by FIG. 5.

Referring to FIG. 6, a layer of photoresist is deposited and patterned to produce photoresist blocks 36, as in the first described embodiment. The photoresist adheres to $Si_3N_4$ layer 28 with a greater degree of adhesion than would otherwise occur if the outer $Si_3N_4$ surface 30 were not oxidized.

Figure 7:
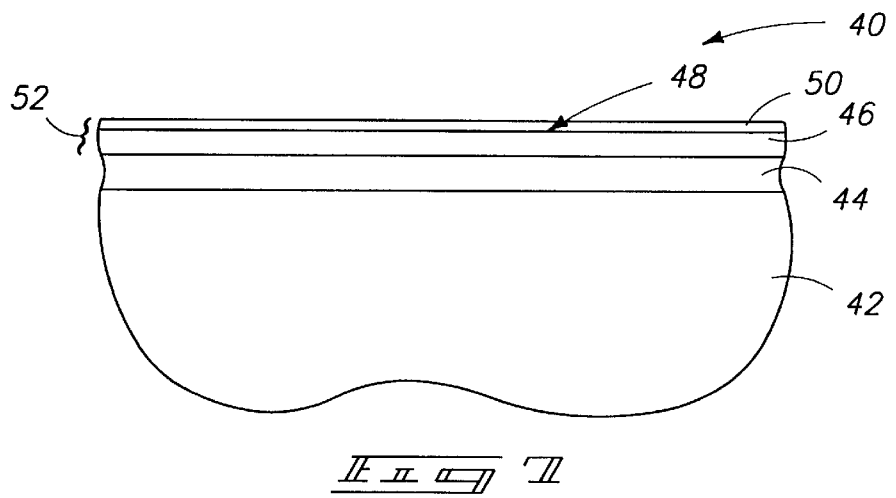
FIG. 7 is a diagrammatic sectional view of yet another alternate embodiment semiconductor wafer fragment at yet another alternate processing step in accordance with the invention.

Other alternate examples are described with reference to FIG. 7, illustrating a semiconductor wafer fragment 40. Such again comprises a substrate composed of a bulk monocrystalline silicon substrate 42 and overlying $SiO_2$ layer 44. An overlying layer 46 of $Si_3N_4$ is provided, preferably as described above with respect to the other embodiments. Nitride layer 46 has an outer surface 48. Subsequently, conditions are provided within a chemical vapor deposition reactor to cover outer $Si_3N_4$ surface 48 with a discrete photoresist adhesion layer 50 having a thickness of preferably from about 10 Angstroms to about 30 Angstroms. Thus, an outer composite substrate layer 52 is provided which predominantly comprises $Si_3N_4$. Example and preferred materials for thin discrete photoresist adhesion layer 50 are silicon or $SiO_2$.

Silicon can be deposited by any typical or known process for depositing polycrystalline silicon atop a semiconductor wafer. An example and preferred method for providing layer 50 to constitute $SiO_2$ is to first purge the reactor after $Si_3N_4$ layer deposition, followed by feeding of DCS and $N_2O$ to the reactor under temperature conditions of 780° C. and 250 mTorr at a volumetric ratio of $DCS:N_2O$ of from 1:3 to 1:10. Subsequently provided photoresist will adhere to $Si_3N_4$ layer 52 with a greater degree of adhesion than would otherwise occur if the intermediate silicon, $SiO_2$, or other adhesion promoting layer were not present.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method comprising:

providing a substrate;

providing an outer layer of $Si_3N_4$ outwardly of the substrate, the outer $Si_3N_4$ layer having an outer surface;

transforming the outer $Si_3N_4$ surface into a material effective to promote adhesion of photoresist to the $Si_3N_4$ layer, the material predominately comprising silicon enriched $Si_3N_4$; and forming a layer of photoresist in physical contact with the transformed outer surface.

2. A semiconductor processing method comprising:

providing a substrate;

placing the substrate within a chemical vapor deposition reactor;

feeding a gaseous silicon containing precursor and a gaseous nitrogen containing precursor to the reactor under conditions effective to deposit a $Si_3N_4$ layer on the substrate;

reducing the gas flow of the nitrogen containing precursor to the reactor to enrich an outermost surface of the deposited $Si_3N_4$ layer with silicon atoms; and depositing a layer of photoresist in physical contact with the silicon enriched outer $Si_3N_1$ surface.

3. The semiconductor processing method of claim 2 wherein the silicon containing precursor comprises dichlorosilane and the nitrogen containing precursor comprises ammonia.

* * * * *